(12) United States Patent
Dorfman

(10) Patent No.: US 8,785,799 B1
(45) Date of Patent: Jul. 22, 2014

(54) MOISTURE BARRIER LAYER DIELECTRIC FOR THERMOFORMABLE CIRCUITS

(71) Applicant: E I du Pont de Nemours and Company, Wilmington, DE (US)

(72) Inventor: Jay Robert Dorfman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 3 days.

(21) Appl. No.: 13/736,142

(22) Filed: Jan. 8, 2013

(51) Int. Cl.
- *H03K 17/80* (2006.01)
- *C08L 71/12* (2006.01)
- *C08L 75/04* (2006.01)

(52) U.S. Cl.
USPC .......... 200/600; 525/393; 525/395; 252/573; 252/575; 252/578

(58) Field of Classification Search
USPC .......... 252/570, 573, 575, 578, 50, 390, 393, 252/395; 200/600
See application file for complete search history.

(56) References Cited

U.S. PATENT DOCUMENTS

| | | | | |
|---|---|---|---|---|
| 3,384,679 A | * | 5/1968 | Stetz, Jr. | 525/438 |
| 4,233,522 A | * | 11/1980 | Grummer et al. | 341/33 |
| 4,529,756 A | * | 7/1985 | Salensky | 523/459 |
| 2004/0009398 A1 | * | 1/2004 | Dorfman | 429/217 |

* cited by examiner

*Primary Examiner* — Thao T. Tran

(57) ABSTRACT

This invention is directed to a polymer thick film moisture barrier layer dielectric composition comprising thermoplastic urethane resin, thermoplastic phenoxy resin, diacetone alcohol and fumed silica. Dielectrics made from the composition can be used in various electronic applications to protect electrical elements and particularly to insulate and protect both the conductive thermoformable silver above it and the polycarbonate substrate below it in capacitive switch applications.

12 Claims, No Drawings

MOISTURE BARRIER LAYER DIELECTRIC FOR THERMOFORMABLE CIRCUITS

FIELD OF THE INVENTION

This invention is directed to a polymer thick film moisture barrier layer dielectric composition. Dielectrics made from the composition can be used in various electronic applications to protect electrical elements and particularly to insulate and protect the conductive thermoformable silver above and below it from moisture in capacitive switches.

BACKGROUND OF THE INVENTION

Dielectrics have long been used to protect electrical elements. They have also been used as isolating layers. Although they have been used for years in these types of applications, the use of dielectrics as moisture barriers during thermoforming procedures is not common. This is particularly important in thermoformable capacitive circuits where highly conductive silver is used and moisture must be prevented from interacting with the silver conductor. One of the purposes of this invention is to alleviate these issues and produce a thermoformable capacitive construction in which the printed silver can be used on a substrate of choice such as a polycarbonate.

SUMMARY OF THE INVENTION

This invention relates to a polymer thick film moisture barrier layer dielectric composition comprising:
(a) a first organic medium comprising 10-50 wt % thermoplastic urethane resin dissolved in an organic solvent, wherein the weight percent is based on the total weight of the first organic medium;
(b) a second organic medium comprising 10-50 wt % thermoplastic phenoxy resin in an organic solvent wherein the weight percent is based on the total weight of the second organic medium;
(c) 1-20 wt % diacetone alcohol, wherein the weight percent is based on the total weight of the composition; and
(d) 0.1-5.0 wt % fumed silica, wherein the weight percent is based on the total weight of the composition.

The invention is further directed to using the moisture barrier layer dielectric composition to form a protective and/or insulating layer in thermoformable capacitive electrical circuits.

DETAILED DESCRIPTION OF INVENTION

The invention relates to a polymer thick film moisture barrier layer dielectric composition for use in thermoforming electrical circuits. A layer of moisture barrier layer dielectric is printed and dried on a substrate so as to protect that substrate from other layers that are subsequently deposited on the moisture barrier layer dielectric.

The substrate commonly used in polymer thick film thermoformable capacitive circuits is polycarbonate (PC). PC is generally preferred since it can be readily thermoformed. However, PC is very sensitive to the solvents used in the layers deposited on it. An inappropriate solvent can and will cause cracking or crazing in the PC substrate.

The polymer thick film (PTF) moisture barrier layer dielectric composition is comprised of (i) two organic media comprising two thermoplastic polymer resins dissolved in the same or different organic solvents, (ii) diacetone alcohol organic solvent, and (iii) fumed silica powder. Additionally, powders and printing aids may be added to the composition.

In an embodiment, the polymer thick film moisture barrier layer dielectric composition can also be described as comprising thermoplastic urethane resin, thermoplastic phenoxy resin, diacetone alcohol and fumed silica.

The polymer thick film moisture barrier layer dielectric composition provides a printable moisture barrier layer that is compatible with polycarbonate, is thermoformable and can be subjected to injection molding and mitigates moisture penetration.

Organic Medium

The first organic medium is comprised of a thermoplastic urethane elastomer resin dissolved in an organic solvent. The urethane resin must achieve good adhesion to both the electrical element, e.g., the silver layer that is deposited on it and the underlying substrate onto which it is deposited. The urethane elastomer must also provide elasticity for thermoforming. It must be compatible with and not adversely affect the performance of the electrical element. In one embodiment the urethane resin is 10-50 wt % of the total weight of the first organic medium. In another embodiment the urethane resin is 25-45 wt % of the total weight of the first organic medium and in still another embodiment the urethane resin is 15-25 wt % of the total weight of the first organic medium. In one embodiment the urethane resin is a urethane elastomer. In another embodiment the urethane resin is a polyester-based copolymer.

The second organic medium is composed of a thermoplastic phenoxy resin dissolved in a solvent that may be the same as was used in the first medium. Other solvents may also be used. The phenoxy resin adds high temperature capability to the composition and improves moisture permeability. That is, it helps impede the progress of moisture through the composition. In one embodiment the phenoxy resin is 10-50 wt % of the total weight of the second organic medium.

Although the preparation of two separate organic media are preferred, if the same solvent is to be used for both media a single organic medium equivalent to the two organic media described above may be used.

The polymer resin is typically added to the organic solvent by mechanical mixing to form the medium. Solvents suitable for use in the organic mediums of the polymer thick film composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin.

Diacetone Alcohol Organic Solvent

The polymer thick film moisture barrier layer dielectric composition also contains diacetone alcohol. This particular solvent has been shown to be compatible with PC and does not cause any appreciable crazing of the substrate. In one embodiment the diacetone alcohol is 1-20 wt % based on the total weight of the composition. In another embodiment the diacetone alcohol is 3-10 wt % of the total weight based on the total weight of the composition and in still another embodiment the diacetone alcohol is 4-6 wt % based on the total weight of the composition.

Additional Powders

Various powders may be added to the PTF moisture barrier layer dielectric composition to improve adhesion, modify the rheology and increase the low shear viscosity thereby improving the printability. One such powder is fumed silica which has been found to significantly improve the resistance to moisture penetration.

Application of the PTF Moisture Barrier Layer Dielectric Composition

The PTF moisture barrier layer dielectric composition, also referred to as a "paste", is typically deposited on a substrate, such as polycarbonate, that is somewhat impermeable to gases and moisture. The substrate can also be a sheet of a composite material made up of a combination of plastic sheet with optional metallic or dielectric layers deposited thereupon.

The deposition of the PTF moisture barrier layer dielectric composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

The PTF moisture barrier layer dielectric composition is processed for a time and at a temperature necessary to remove all solvent. For example, the deposited thick film is dried by exposure to heat at 130° C. for typically 10-15 min.

Capacitive Circuit Construction

The base substrate used is typically 10 mil thick polycarbonate. The moisture barrier layer dielectric is printed and dried as per the conditions described above. Several layers can be printed and dried. A thermoformable conductive silver composition such as DuPont 5042 is then printed and dried under the same conditions used for the barrier layer, A moisture barrier layer may then be printed above the silver conductor forming a protective sandwich. A subsequent step which may include thermoforming of the entire unit is typical in the production of 3D circuits. If the moisture barrier layer dielectric is not used, the silver composition will be subject to moisture penetration through the polycarbonate substrate and the functional circuit will suffer, often leading to reduced lifetimes.

EXAMPLES AND COMPARATIVE EXPERIMENT

Example 1

The PTF moisture barrier layer dielectric composition was prepared in the following manner. The organic medium was prepared by mixing 20.0 wt % Desmocoll 540 polyurethane (Bayer MaterialScience LLC, Pittsburgh, Pa.) with 80.0 wt % dibasic esters (obtained from DuPont Co., Wilmington, Del.) organic solvent. The molecular weight of the resin was approximately 40,000. This mixture was heated at 90° C. for 1-2 hours to dissolve all the resin. The second organic medium was prepared by adding 27.0 wt % PKHH resin (InChem Inc.) to 73.0 wt % dibasic esters (obtained from DuPont Co., Wilmington, Del.) organic solvent and heated as above. 0.5% fumed silica (Cabot Corp). was then added. 5% diacetone alcohol (obtained from Eastman Chemical, Kingsport, Tenn.) was added and the entire composition was mixed. The composition was then subjected to the three-roll-mill for one cycle at 150 psi.

The composition, based on the total weight of the composition, was:

| | |
|---|---|
| 47.50 wt % | First Organic Medium |
| 47.00 | Second Organic Medium |
| 5.00 | Diacetone Alcohol Solvent |
| 0.50 | Fumed Silica |

Example 2

A circuit was fabricated as follows: On a 10 mil thick polycarbonate substrate, a blanket print of the composition from Example 1 was printed with a 200 stainless steel screen and dried at 120° C. for 10 min. A second print of the composition was then printed and dried. A pattern of silver lines were printed with DuPont silver paste 5042 (DuPont Co., Wilmington, Del.) using a 280 mesh stainless steel screen. The patterned lines were dried at 120° C. for 15 min. in a forced air box oven. The part was inspected and no evidence of crazing or deformation of the underlying substrate was found. The circuit was then subjected to thermoforming conditions (160° C./10 sec). Resistance was then measured and recorded. The parts were then subjected to 85° C./85% relative humidity for 100 hours to simulate accelerated aging conditions and resistance was again measured. The change in resistance as a result of the simulated aging was recorded as Delta R and is shown in Table 1.

Comparative Experiment 1

A circuit was produced exactly as described in Example 2. The only difference was that the moisture barrier layer dielectric composition was not used. The change in resistance as a result of the simulated aging was recorded as Delta R and is shown in Table 1.

Example 3

A circuit was produced exactly as described in Example 2. The only difference was that the moisture barrier layer dielectric composition was printed both below and above the 5042 silver conductor. The change in resistance as a result of the simulated aging was recorded as Delta R and is shown in Table 1.

The improvement in performance as a result of the moisture barrier layer dielectric is apparent from the results shown in Table 1.

TABLE 1

| | Description | Delta R |
|---|---|---|
| Comp. Exp. 1 | 5042 alone | −34.0% |
| Example 2 | Moisture Barrier + 5042 | −8.0% |
| Example 3 | Moisture Barrier + 5042 + Moisture Barrier | −2.2% |

What is claimed is:

1. A polymer thick film barrier layer dielectric composition consisting essentially of:
   (a) a first organic medium comprising 10-50 wt % a thermoplastic urethane resin dissolved in an organic solvent, wherein the weight percent is based on the total weight of said first organic medium;
   (b) a second organic medium comprising 10-50 wt % a thermoplastic phenoxy resin in an organic solvent wherein the weight percent is based on the total weight of said second organic medium;
   (c) 1-20 wt % diacetone alcohol, wherein the weight percent is based on the total weight of the composition; and
   (d) 0.1-5.0 wt % fumed silica, wherein the weight percent is based on the total weight of the composition.

2. The polymer thick film barrier layer dielectric composition of claim 1, wherein said thermoplastic urethane resin is a urethane elastomer or a polyester-based copolymer.

3. The polymer thick film barrier layer dielectric composition of claim 2, wherein said thermoplastic urethane resin is a polyester-based copolymer.

4. A polymer thick film moisture barrier layer dielectric composition consisting essentially of:
   (a) a thermoplastic urethane resin;
   (b) a thermoplastic phenoxy resin;
   (c) diacetone alcohol; and
   (d) fumed silica.

5. The polymer thick film barrier layer dielectric composition of claim 4, wherein said thermoplastic urethane resin is a urethane elastomer or a polyester-based copolymer.

6. The polymer thick film barrier layer dielectric composition of claim 5, wherein said thermoplastic urethane resin is a polyester-based copolymer.

7. A capacitive switch circuit comprising a barrier layer dielectric formed from the polymer thick film moisture barrier layer dielectric composition of claim 1.

8. The capacitive switch circuit of claim 7, wherein said thermoplastic urethane resin is a urethane elastomer or a polyester-based copolymer.

9. The capacitive switch circuit of claim 8, wherein said thermoplastic urethane resin is a polyester-based copolymer.

10. The capacitive switch circuit of claim 7, wherein said circuit is thermoformed.

11. The capacitive switch circuit of claim 8, wherein said circuit is thermoformed.

12. The capacitive switch circuit of claim 9, wherein said circuit is thermoformed.

* * * * *